(12) United States Patent
Wang et al.

(10) Patent No.: US 12,507,378 B2
(45) Date of Patent: Dec. 23, 2025

(54) HEAT DISSIPATION DEVICE AND MANUFACTURING METHOD THEREFOR

(71) Applicant: PURPLE CLOUD DEVELOPMENT PTE. LTD., Singapore (SG)

(72) Inventors: Xue Mei Wang, Hui Zhou (CN); Xiao Min Zhang, Hui Zhou (CN); Xianyao Liu, Hui Zhou (CN)

(73) Assignee: PURPLE CLOUD DEVELOPMENT PTE. LTD., Singapore (SG)

( * ) Notice: Subject to any disclaimer, the term of this patent is extended or adjusted under 35 U.S.C. 154(b) by 182 days.

(21) Appl. No.: 17/985,031

(22) Filed: Nov. 10, 2022

(65) Prior Publication Data
US 2024/0074114 A1 Feb. 29, 2024

(30) Foreign Application Priority Data
Aug. 31, 2022 (CN) .......................... 202211052555.1

(51) Int. Cl.
*H05K 7/20* (2006.01)

(52) U.S. Cl.
CPC ....... *H05K 7/2039* (2013.01); *H05K 7/20336* (2013.01)

(58) Field of Classification Search
CPC .. H05K 7/2039; H05K 7/20336; F28D 15/02; F28D 15/0233; F28D 15/0275
See application file for complete search history.

(56) References Cited

U.S. PATENT DOCUMENTS

| | | | | |
|---|---|---|---|---|
| 6,899,165 B1* | 5/2005 | Wu | ...................... | F28D 15/046 165/104.21 |
| 7,342,788 B2* | 3/2008 | Nikfar | ................. | F28D 15/0233 165/104.33 |
| 7,520,316 B2* | 4/2009 | Xia | ..................... | F28D 15/0275 165/104.21 |
| 7,621,316 B2* | 11/2009 | Kawabata | ........... | F28D 15/0275 165/104.21 |
| 2005/0098300 A1* | 5/2005 | Kawabata | ................. | F28F 3/02 165/80.3 |
| 2005/0257532 A1* | 11/2005 | Ikeda | ..................... | F25B 21/02 62/3.7 |

(Continued)

FOREIGN PATENT DOCUMENTS

JP 2009270750 A * 11/2009 ......... F28D 15/0275
TW I285077 B 8/2007

(Continued)

*Primary Examiner* — Nelson J Nieves
(74) *Attorney, Agent, or Firm* — Merchant & Gould P.C.

(57) ABSTRACT

A heat dissipation device includes a thermally-conductive base and at least one heat pipe. The thermally-conductive base has a heat absorbing surface, a heat dissipation surface and at least one accommodation hole. The heat dissipation surface faces away from the heat absorbing surface, and the at least one accommodation hole extends from the heat absorbing surface to the heat dissipation surface. The at least one heat pipe is located in the at least one accommodation hole and has a first surface and a second surface which are exposed to outside. The second surface faces away from the first surface, and the first surface and the heat dissipation surface are substantially coplanar and directly connected to each other so as to form a same plane together.

12 Claims, 10 Drawing Sheets

(56) References Cited

U.S. PATENT DOCUMENTS

| | | | | |
|---|---|---|---|---|
| 2006/0059684 A1* | 3/2006 | Lee | ............... | H01L 21/4882 |
| | | | | 257/E23.088 |
| 2007/0187069 A1* | 8/2007 | Ueno | ............... | H01L 23/427 |
| | | | | 165/104.33 |
| 2007/0261244 A1* | 11/2007 | Cheng | ............. | F28D 15/0275 |
| | | | | 29/890.032 |
| 2008/0142193 A1* | 6/2008 | Li | ............... | B21D 53/08 |
| | | | | 165/104.33 |
| 2008/0283234 A1* | 11/2008 | Sagi | ............... | H01L 23/427 |
| | | | | 165/182 |
| 2009/0266522 A1* | 10/2009 | Lin | ............... | H01L 23/427 |
| | | | | 29/890.032 |
| 2010/0083500 A1* | 4/2010 | Lin | ............... | B21D 53/02 |
| | | | | 29/890.03 |
| 2010/0212869 A1* | 8/2010 | Liu | ............... | H01L 23/467 |
| | | | | 165/104.33 |
| 2012/0067550 A1* | 3/2012 | Shih | ............... | H01L 23/427 |
| | | | | 165/104.21 |
| 2012/0273168 A1* | 11/2012 | Peng | ............... | F28D 15/0275 |
| | | | | 165/104.26 |
| 2012/0318480 A1* | 12/2012 | Lin | ............... | F28D 15/0233 |
| | | | | 29/890.03 |
| 2015/0062820 A1* | 3/2015 | Lam | ............... | H01L 23/473 |
| | | | | 361/718 |
| 2016/0295739 A1* | 10/2016 | Ahamed | ............... | F28D 15/046 |
| 2017/0151641 A1* | 6/2017 | Lin | ............... | H01L 21/4882 |
| 2024/0102741 A1* | 3/2024 | Yang | ............... | H01L 23/427 |

FOREIGN PATENT DOCUMENTS

| | | | |
|---|---|---|---|
| TW | M427769 | U1 | 4/2012 |
| TW | 201708783 | A * | 3/2017 |
| TW | I597466 | B | 9/2017 |
| TW | M623450 | U | 1/2022 |

* cited by examiner

HEAT DISSIPATION DEVICE AND MANUFACTURING METHOD THEREFOR

CROSS-REFERENCE TO RELATED APPLICATIONS

This non-provisional application claims priority under 35 U.S.C. § 119(a) on Patent Application No(s). 202211052555.1 filed in China on Aug. 31, 2022, the entire contents of which are hereby incorporated by reference.

TECHNICAL FIELD

The disclosure relates to a heat dissipation device and a manufacturing method therefor, more particularly to a heat dissipation device having a heat pipe and a manufacturing method therefor.

BACKGROUND

As the rapid development of information, communication and optoelectronic industries, electronic products become more powerful and thinner. Due to the requirements of high speed, high frequency and small size, electronic components of an electronic product are arranged closer. Therefore, the heat dissipation efficiency of the electronic product is one of the crucial factors to determine the stability of the electronic product. In general, heat pipes may be disposed on a base that is in thermal contact with a heat sink, such that the heat pipe may be in thermal contact with the heat sink along with the base for increasing the heat conduction efficiency.

However, surfaces of the heat pipes and the base that are in contact with the heat sink are uneven, and thus the heat dissipation efficiency of a heat dissipation device consisting of the base, the heat pipes and the heat sink is difficult to be improved.

SUMMARY

The disclosure provides a heat dissipation device and a manufacturing method therefor which are capable of improving the heat dissipation efficiency of the heat dissipation device.

One embodiment of the disclosure provides a heat dissipation device. The heat dissipation device includes a thermally-conductive base and at least one heat pipe. The thermally-conductive base has a heat absorbing surface, a heat dissipation surface and at least one accommodation hole. The heat dissipation surface faces away from the heat absorbing surface, and the at least one accommodation hole extends from the heat absorbing surface to the heat dissipation surface. The at least one heat pipe is located in the at least one accommodation hole and has a first surface and a second surface which are exposed to outside. The second surface faces away from the first surface, and the first surface and the heat dissipation surface are substantially coplanar and directly connected to each other so as to form a same plane together.

Another embodiment of the disclosure provides a manufacturing method for heat dissipation device. The manufacturing method includes placing at least one heat pipe into at least one accommodation hole of a thermally-conductive base, performing a first mechanical processing procedure to squeeze the at least one heat pipe so as to flatten a first surface of the at least one heat pipe relative to a heat dissipation surface of the thermally-conductive base, and performing a second mechanical processing procedure to abrade the heat dissipation surface of the thermally-conductive base and the first surface of the at least one heat pipe so as to make the first surface of the at least one heat pipe and the heat dissipation surface of the thermally-conductive base substantially coplanar and directly connected to each other for forming a same plane together.

According to the heat dissipation device and the manufacturing method therefor, the first mechanical processing procedure is performed to squeeze the heat pipe to flatten the first surface of the heat pipe relative to the heat dissipation surface of the thermally-conductive base, and the second mechanical processing procedure is further performed to abrade the heat dissipation surface of the thermally-conductive base and the first surface of the heat pipe to make the first surface of the heat pipe and the heat dissipation surface of the thermally-conductive base substantially coplanar and directly connected to each other for forming the same plane together. Therefore, the distance between the first surface of the heat pipe and the heat dissipation surface of the thermally-conductive base in the thickness direction can be smaller than 0.05 mm, such that the overall flatness of the first surface of the heat pipe and the heat dissipation surface of the thermally-conductive base may be improved, thereby increasing the heat conduction efficiency among the thermally-conductive base, the heat pipe and the heat exchanger, and thus enhancing the heat dissipation efficiency of the heat dissipation device.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
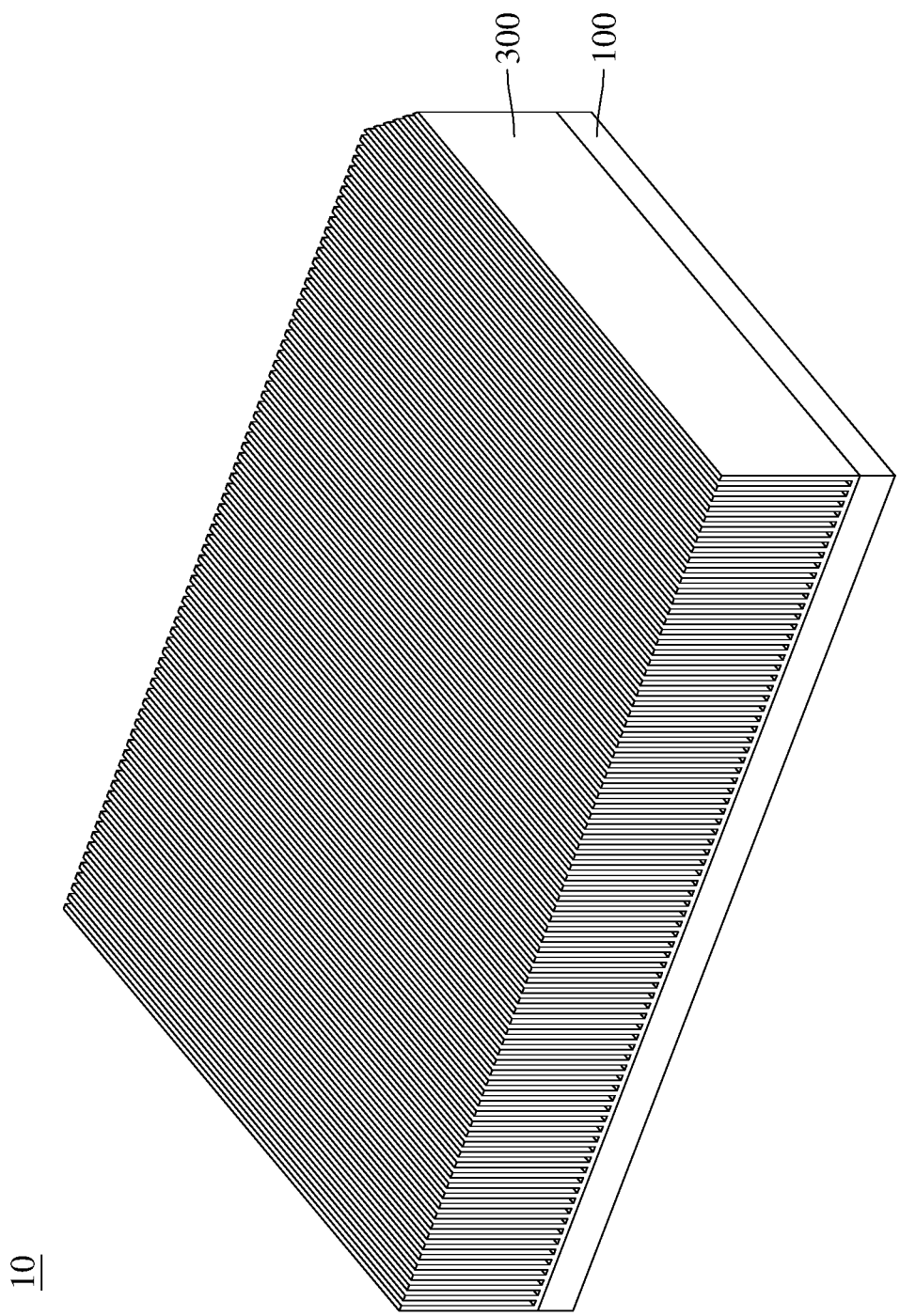
FIG. 1 is a perspective view of a heat dissipation device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
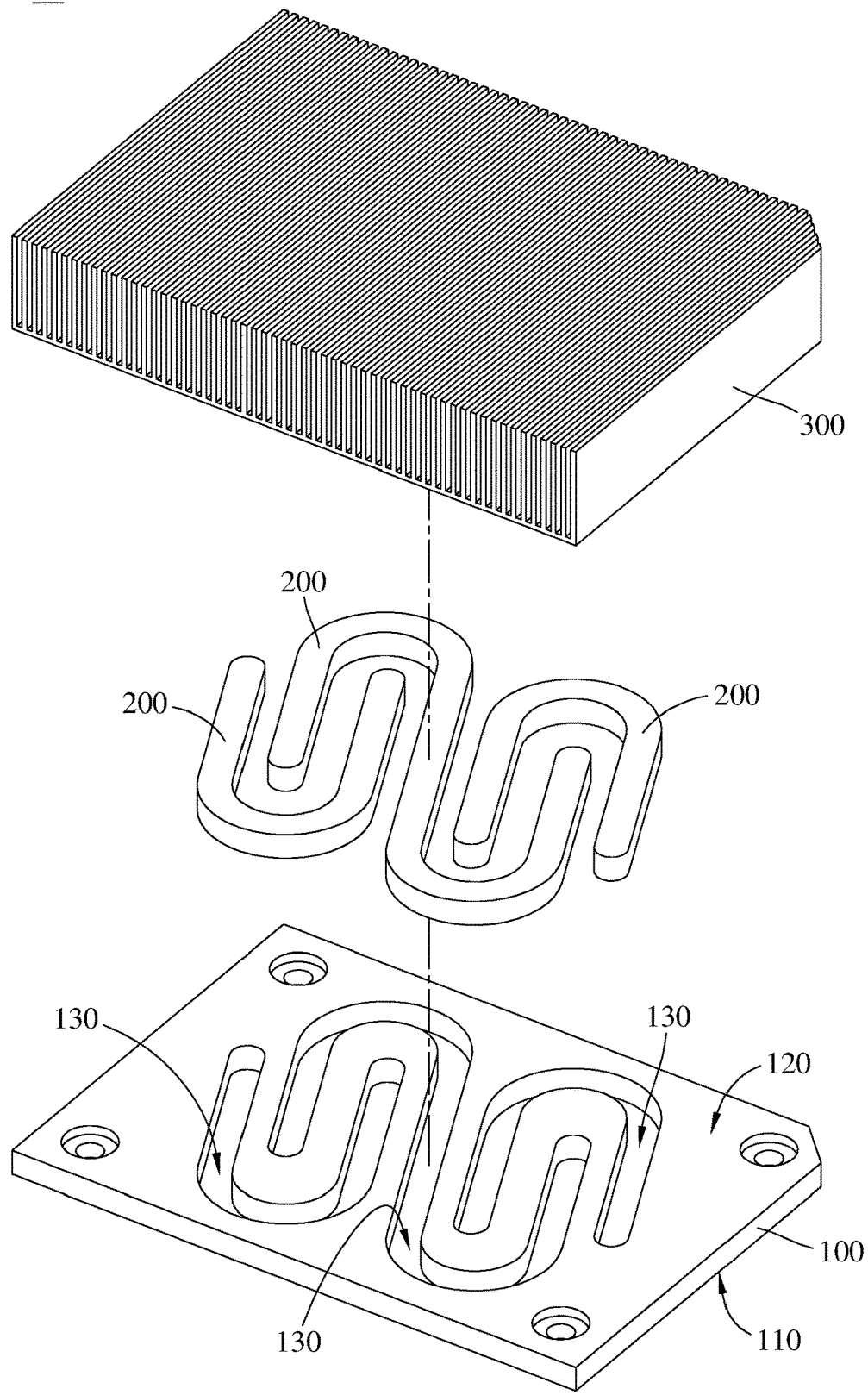
FIG. 2 is an exploded view of the heat dissipation device in FIG. 1.
Figure 3:
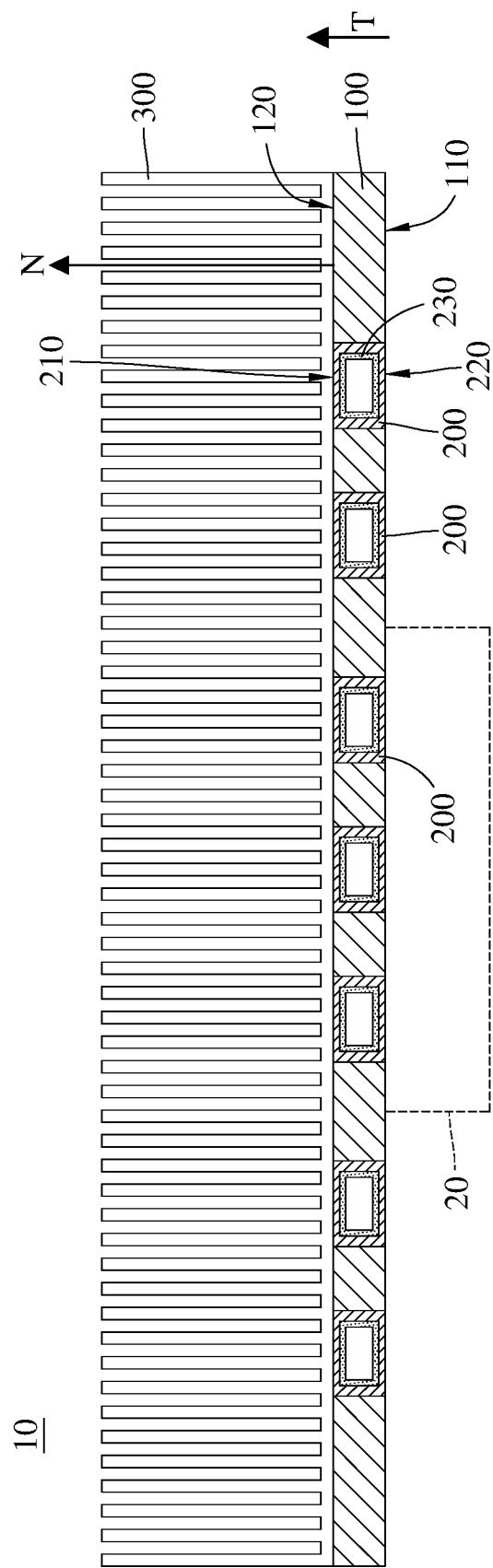
FIG. 3 is a cross-sectional view of the heat dissipation device in FIG. 1.

Refer to FIGS. 1 to 3, FIG. 1 is a perspective view of a heat dissipation device 10 according to a first embodiment of the disclosure, FIG. 2 is an exploded view of the heat dissipation device 10 in FIG. 1, and FIG. 3 is a cross-sectional view of the heat dissipation device 10 in FIG. 1.

In this embodiment, the heat dissipation device 10 includes a thermally-conductive base 100 and a plurality of heat pipes 200. The thermally-conductive base 100 is, for example, made of aluminum material. The thermally-conductive base 100 has a heat absorbing surface 110, a heat dissipation surface 120 and a plurality of accommodation holes 130. The heat absorbing surface 110 is configured to be in thermal contact or coupled with a heat source 20. The heat source 20 is, for example, a CPU or a GPU. The heat dissipation surface 120 faces away from the heat absorbing surface 110, and the accommodation holes 130 extend from the heat absorbing surface 110 to the heat dissipation surface 120.

Cross sections of the heat pipes 200 are each in a quadrilateral shape. The heat pipes 200 are respectively located in the accommodation holes 130, and each of the heat pipes 200 has a first surface 210 and a second surface 220 exposed to outside. The second surface 220 faces away from the first surface 210. The second surface 220 is configured to be in thermal contact with or coupled with the heat source 20. The first surface 210 and the heat dissipation surface 120 are substantially coplanar and directly connected to each other so as to form a same plane together, and the second surface 220 and the heat absorbing surface 110 are substantially coplanar and directly connected to each other so as to form a same plane together. A thickness direction T is defined to be parallel to a normal line N of the heat dissipation surface 120, and the first surface 210 and the heat dissipation surface 120 are substantially coplanar, which represents that a distance between the first surface 210 and the heat dissipation surface 120 in the thickness direction T is smaller than 0.05 mm. In addition, the heat pipes 200 each has a capillary structure 230 therein for increasing the heat conduction efficiency of the heat pipes 200.

In this embodiment, the heat dissipation device 10 may further include a heat exchanger 300. The heat exchanger 300 is, for example, a fin assembly. The heat exchanger is stacked on the heat dissipation surface 120 of the thermally-conductive base 100 and the first surfaces 210 of at least some of the heat pipes 200.

Note that the quantities of the accommodation holes 130 and the heat pipes 200 are not restricted and may be modified to be one in some other embodiments.

Note that the second surface 220 and the heat absorbing surface 110 are not restricted to being substantially coplanar and directly connected to each other so as to form the same plane together. In some other embodiments, the second surface and the heat absorbing surface may not be substantially coplanar and directly connected to each other so as to form a same plane Then, refer to FIGS. 4 to 7, FIG. 4 is a flow chart of a manufacturing method for the heat dissipation device 10 in FIG. 1, and FIGS. 5 to 7 show the manufacturing process for the heat dissipation device 10 in FIG. 1.

Figure 4:
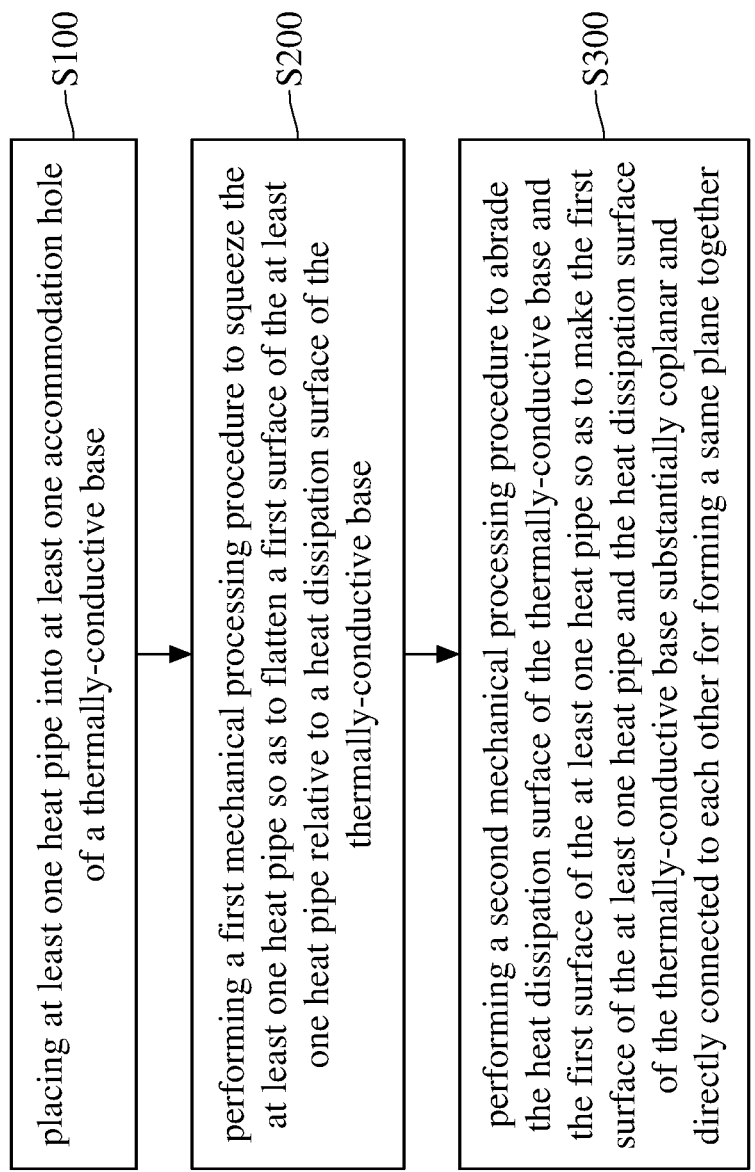
FIG. 4 is a flow chart of a manufacturing method for the heat dissipation device in FIG.
Figure 5:
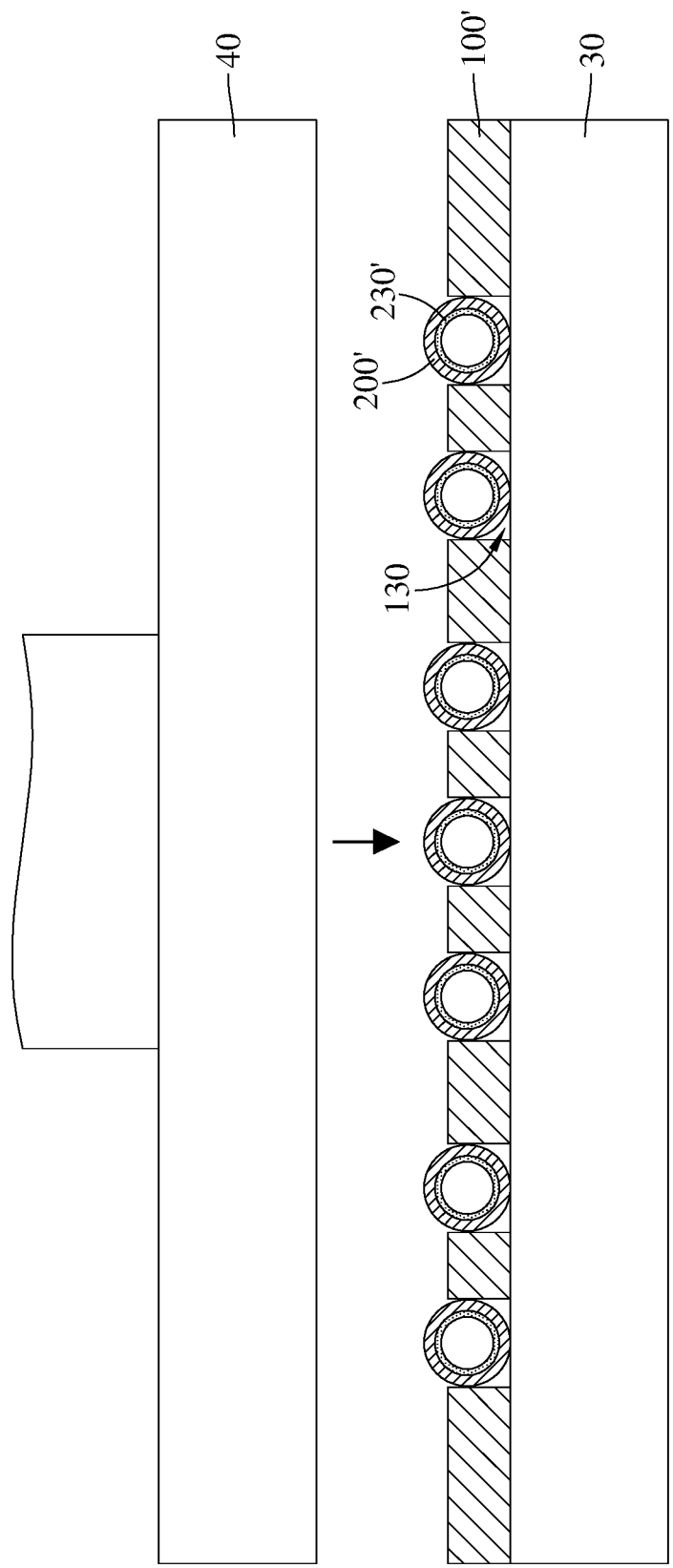
FIGS. 5 to 7 show the manufacturing process for the heat dissipation device in FIG. 1.
Figure 6:
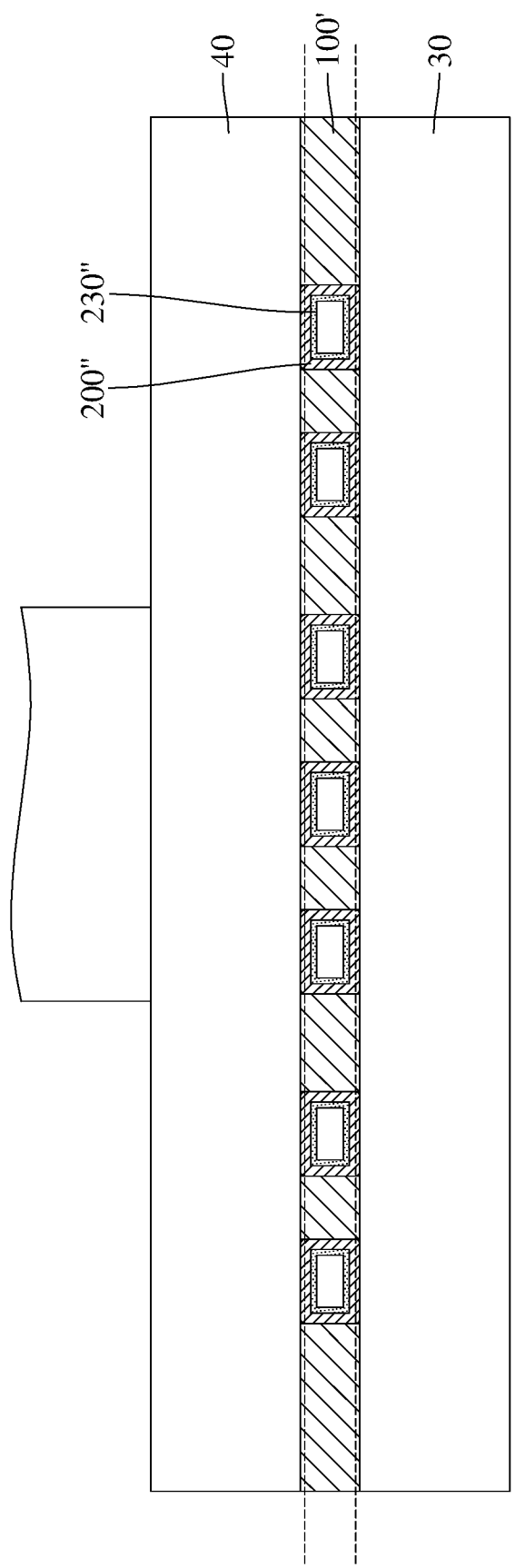
Figure 7:
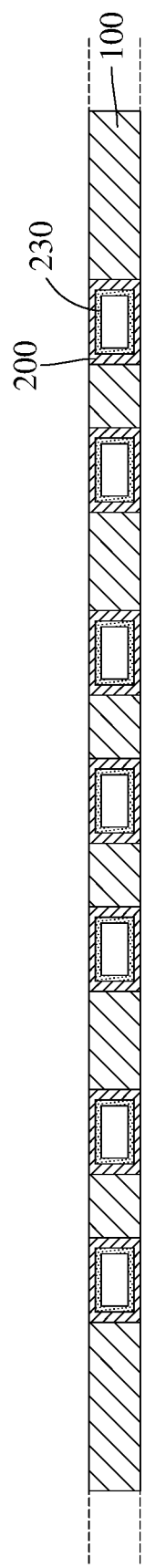

As shown in FIGS. 4 and 5, the first step is to place at least one heat pipe 200' into at least one accommodation hole 130 of a thermally-conductive base 100'. Specifically, the heat pipe 200' is, for example a round pipe, and a capillary structure 230' in the heat pipe 200' is, for example, in a ring shape. The heat pipe 200' located in the accommodation hole 130 of the thermally-conductive base 100' protrudes from the heat dissipation surface 120 of the thermally-conductive base 100'. Then, as shown in FIGS. 4 and 6, the second step is to perform a first mechanical processing procedure to squeeze the heat pipe 200' to flatten the first surface 210 of the heat pipe 200'' relative to the heat dissipation surface 120 of the thermally-conductive base 100'. Specifically, the first mechanical processing procedure is, for example, a stamping process procedure. In this process, stamping molds 30 and 40 together squeeze the round heat pipe 200' so as to form the quadrilateral heat pipe 200'', and the capillary structure 230' in the ring shape is squeezed to be the capillary structure 230'' in the quadrilateral shape. Note that the first mechanical processing procedure is not restricted to being the stamping process procedure and may be a trundle processing procedure, the extrusion processing procedure or forging processing procedure. Then, as shown in FIGS. 4 and 7, the third step is to perform a second mechanical processing procedure to abrade the heat dissipation surface 120 of the thermally-conductive base 100' and the first surface 210 of the heat pipe 200'' to make the first surface 210 of the heat pipe 200 and the heat dissipation surface 120 of the thermally-conductive base 100 substantially coplanar and directly connected to each other for forming a same plane together. Specifically, the second mechanical process procedure is, for example, a cutting process procedure or an abrasion processing procedure. During this procedure, at least part of the heat pipe 200'' on the first surface 210 and at least part of the thermally-conductive base 100' on the heat dissipation surface 120 are removed by a cutting device or an abrasion device.

In this embodiment, a cutting or abrasion depth in the second mechanical processing procedure is larger than or equal to 0.05 mm, and is smaller than or equal to 0.2 mm. In addition, the distance between the first surface 210 of the heat pipe 200 and the heat dissipation surface 120 in the thickness direction T is smaller than 0.05 mm, and a distance between the second surface 220 of the heat pipe 200 and the heat absorbing surface 110 in the thickness direction T is smaller than 0.05 mm.

Then, as shown in FIG. 3, the next step is to stack the heat exchanger 300 on the heat dissipation surface 120 of the thermally-conductive base 100 and the first surface 210 of the heat pipe 200.

When there is only the first mechanical processing procedure performed to squeeze the heat pipe, the first surface 210 of the heat pipe 200 is flattened relative to the heat dissipation surface 120 of the thermally-conductive base 100, but the distance between the first surface 210 of the heat pipe 200 and the heat dissipation surface 120 of the thermally-conductive base 100 in the thickness direction T may be larger than or equal to 0.05 mm, which causes poor overall flatness of the first surface 210 of the heat pipe 200 and the heat dissipation surface 120 of the thermally-conductive base 100. In this embodiment, the second mechanical processing procedure is further performed to abrade the heat dissipation surface 120 of the thermally-conductive base 100 and the first surface 210 of the heat pipe 200, such that the distance between the first surface 210 and the heat dissipation surface 120 of the thermally-conductive base 100 in the thickness direction T can be smaller than 0.05 mm. Therefore, the overall flatness of the first surface 210 of the heat pipe 200 and the heat dissipation surface 120 of the thermally-conductive base 100 may be improved, thereby increasing the heat conduction efficiency among the thermally-conductive base 100, the heat pipe 200 and the heat exchanger 300, and thus enhancing the heat dissipation efficiency of the heat dissipation device 10.

Similarly, the overall flatness of the second surface 220 of the heat pipe 200 and the heat absorbing surface 110 of the thermally-conductive base 100 may be improved, thereby increasing the heat conduction efficiency among the thermally-conductive base 100, the heat pipe 200 and the heat source 20, and thus enhancing the heat dissipation efficiency of the heat dissipation device 10.

In this embodiment, the first mechanical processing procedure is performed to simultaneously flatten the first surface 210 and the second surface 220 of the heat pipe 200 relative to the heat dissipation surface 120 and the heat absorbing surface 110 of the thermally-conductive base 100, but the disclosure is not limited thereto; in some other embodiments, the first mechanical processing procedure may be firstly performed to flatten the first surface of the heat pipe relative to the heat dissipation surface of the thermally-conductive base, then flatten the second surface of the heat pipe relative to the heat absorbing surface of the thermally-conductive base. In another embodiment, the first mechanical processing procedure may be performed to merely flatten the first surface of the heat pipe relative to the heat dissipation surface of the thermally-conductive base.

Similarly, the second mechanical processing procedure is performed to make the first surface 210 of the heat pipe 200 and the heat dissipation surface 120 of the thermally-conductive base 100 substantially coplanar and directly connected to each other so as to together form the same plane, and make the second surface 220 of the heat pipe 200 and the heat absorbing surface 110 of the thermally-conductive base 100 substantially coplanar and directly connected to each other so as to together form the same plane, simultaneously, but the disclosure is not limited thereto. In some other embodiments, the second mechanical processing procedure may be firstly performed to make the first surface of the heat pipe and the heat dissipation surface of the thermally-conductive base substantially coplanar and directly connected to each other so as to together form the same plane, then to make the second surface of the heat pipe and the heat absorbing surface of the thermally-conductive base substantially coplanar and directly connected to each other so as to together form the same plane. In another embodiment, the second mechanical processing procedure may be merely performed to make the first surface of the heat pipe and the heat dissipation surface of the thermally-conductive base substantially coplanar and directly connected to each other so as to together form the same plane.

Figure 8:
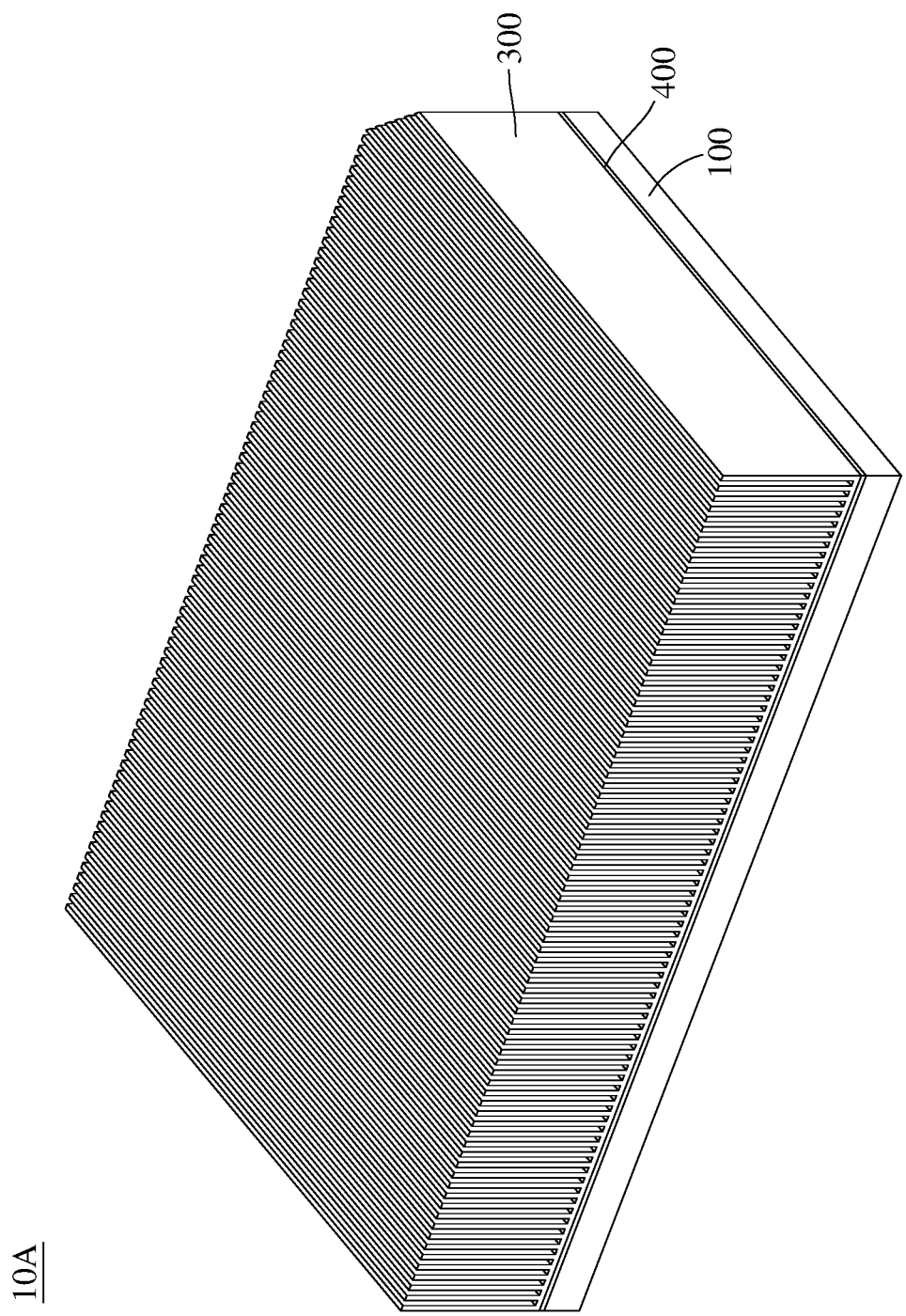
FIG. 8 is a perspective view of a heat dissipation device according to a second embodiment of the disclosure.
Figure 9:
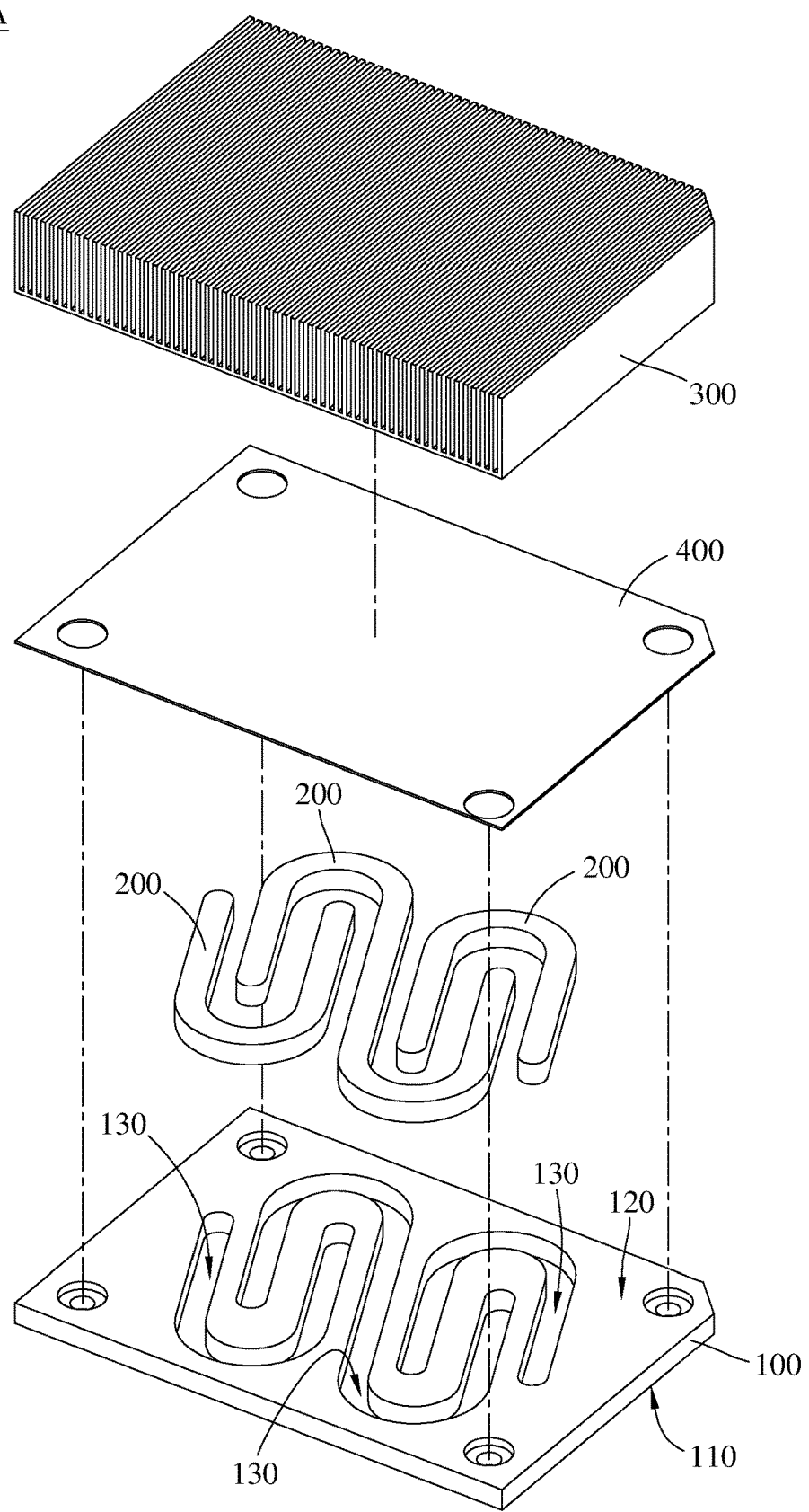
FIG. 9 is an exploded view of the heat dissipation device in FIG. 8.
Figure 10:
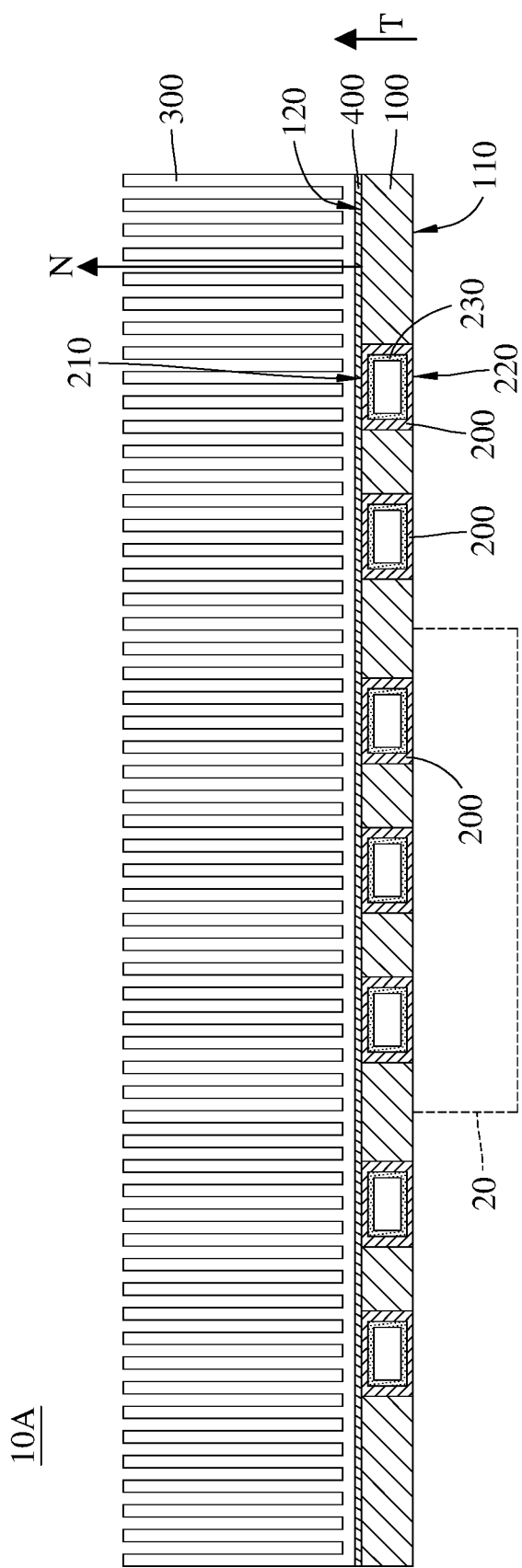
FIG. 10 is a cross-sectional view of the heat dissipation device in FIG. 8.

Refer to FIGS. 8 to 10, FIG. 8 is a perspective view of a heat dissipation device 10A according to a second embodiment of the disclosure, FIG. 9 is an exploded view of the heat dissipation device 10A in FIG. 8, and FIG. 10 is a cross-sectional view of the heat dissipation device 10A in FIG. 8. In this embodiment, the heat dissipation device 10A includes a thermally-conductive base 100 and a plurality of heat pipes 200. The thermally-conductive base 100 is, for example, made of aluminum material. The thermally-conductive base 100 has a heat absorbing surface 110, a heat dissipation surface 120 and a plurality of accommodation holes 130. The heat absorbing surface 110 is configured to be in thermal contact or coupled with a heat source 20. The heat source 20 is, for example, a CPU or a GPU. The heat dissipation surface 120 faces away from the heat absorbing surface 110, and the accommodation holes 130 extend from the heat absorbing surface 110 to the heat dissipation surface 120.

Cross sections of the heat pipes 200 are each in a quadrilateral shape. The heat pipes 200 are respectively located in the accommodation holes 130, and each of the heat pipes 200 has a first surface 210 and a second surface 220 exposed to outside. The second surface 220 faces away from the first surface 210. The second surface 220 is configured to be in thermal contact with or coupled with the heat source 20. The first surface 210 and the heat dissipation surface 120 are substantially coplanar and directly connected to each other so as to form a same plane together, and the second surface 220 and the heat absorbing surface 110 are substantially coplanar and directly connected to each other so as to form a same plane together. A thickness direction T is defined to be parallel to a normal line N of the heat dissipation surface 120, and the first surface 210 and the heat dissipation surface 120 are substantially coplanar, which represents that a distance between the first surface 210 and the heat dissipation surface 120 in the thickness direction T is smaller than 0.05 mm. In addition, the heat pipes 200 each has a capillary structure 230 therein for increasing the heat conduction efficiency of the heat pipes 200.

In this embodiment, the heat dissipation device 10A may further include a thermally-conductive layer 400 and a heat exchanger 300. The thermally-conductive layer 400 is, for example, made of aluminum material. The thermally-conductive layer 400 is stacked on the heat dissipation surface 120 of the thermally-conductive base 100. The heat exchanger 300 is, for example, a fin assembly. The heat exchanger is stacked on the thermally-conductive layer 400. A thermal conductivity of the thermally-conductive layer 400 is greater than a thermal conductivity of the thermally-conductive base 100.

Note that the quantities of the accommodation holes 130 and the heat pipes 200 are not restricted and may be modified to be one in some other embodiments.

According to the heat dissipation devices and the manufacturing method therefor, the first mechanical processing procedure is performed to squeeze the heat pipe to flatten the first surface of the heat pipe relative to the heat dissipation surface of the thermally-conductive base, and the second mechanical processing procedure is further performed to abrade the heat dissipation surface of the thermally-conductive base and the first surface of the heat pipe to make the first surface of the heat pipe and the heat dissipation surface of the thermally-conductive base substantially coplanar and directly connected to each other for forming the same plane together. Therefore, the distance between the first surface of the heat pipe and the heat dissipation surface of the thermally-conductive base in the thickness direction can be smaller than 0.05 mm, such that the overall flatness of the first surface of the heat pipe and the heat dissipation surface of the thermally-conductive base may be improved, thereby increasing the heat conduction efficiency among the thermally-conductive base, the heat pipe and the heat exchanger, and thus enhancing the heat dissipation efficiency of the heat dissipation device. Moreover, the overall flatness of the second surface of the heat pipe and the heat absorbing surface of the thermally-conductive base may be improved, thereby increasing the heat conduction efficiency among the thermally-conductive base, the heat pipe and the heat source, and thus enhancing the heat dissipation efficiency of the heat dissipation device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation device, comprising:
a thermally-conductive base, having a heat absorbing surface, a heat dissipation surface and a plurality of accommodation holes, wherein the heat absorbing surface is coupled to a heat source, the heat dissipation surface faces away from the heat absorbing surface, and the accommodation holes extend from the heat absorbing surface to the heat dissipation surface; and
a plurality of heat pipes having a nonuniform spacing in the thermally-conductive base, each of the heat pipes being located in the corresponding accommodation hole and having a first surface and a second surface which are exposed to outside, wherein the second surface faces away from the first surface, and the first surface and the heat dissipation surface are substantially coplanar and directly connected to each other so as to form a same plane together, at least one of the heat pipes is positioned in a region of the heat absorbing surface that lies outside a thermal contact region of the heat source and receives heat conducted from a portion of the thermally-conductive base that does not directly contact the heat source, and the number of heat pipes lying outside the thermal contact region is different than the number of heat pipes lying inside the thermal contact region.

2. The heat dissipation device according to claim 1, wherein the second surface and the heat absorbing surface are substantially coplanar and directly connected to each other so as to form a same plane together.

3. The heat dissipation device according to claim 1, further comprising a heat exchanger, wherein the heat exchanger is stacked on the heat dissipation surface of the thermally-conductive base.

4. The heat dissipation device according to claim 1, further comprising a thermally-conductive layer and a heat exchanger, wherein the thermally-conductive layer is stacked on the heat dissipation surface of the thermally-conductive base, the heat exchanger is stacked on the thermally-conductive layer, and a thermal conductivity of the thermally-conductive layer is greater than a thermal conductivity of the thermally-conductive base.

5. The heat dissipation device according to claim 3, wherein the heat exchanger is a fin assembly.

6. A manufacturing method for heat dissipation device, comprising:
placing a plurality of heat pipes having a nonuniform spacing into a plurality of accommodation holes of a thermally-conductive base, respectively, wherein at least one of the heat pipes is positioned in a region of the heat absorbing surface that lies outside a thermal contact region of the heat source and receives heat conducted from a portion of the thermally-conductive base that does not directly contact the heat source, and the number of heat pipes lying outside the thermal contact region is different than the number of heat pipes lying inside the thermal contact region;
performing a first mechanical processing procedure to squeeze the plurality of heat pipes so as to flatten a first surface of the plurality of heat pipes relative to a heat dissipation surface of the thermally-conductive base; and
performing a second mechanical processing procedure to abrade the heat dissipation surface of the thermally-conductive base and the first surface of the plurality of heat pipes so as to make the first surface of the plurality of heat pipes and the heat dissipation surface of the thermally-conductive base substantially coplanar and directly connected to each other for forming a same plane together.

7. The manufacturing method according to claim 6, further comprising: stacking a heat exchanger on the heat dissipation surface of the thermally-conductive base and the first surface of the plurality of heat pipes.

8. The manufacturing method according to claim 6, further comprising: stacking a thermally-conductive layer on the heat dissipation surface of the thermally-conductive base and the first surface of the plurality of heat pipes, and stacking a heat exchanger on the thermally-conductive layer.

9. The manufacturing method according to claim 6, further comprising: performing the first mechanical processing procedure to squeeze the plurality of heat pipes so as to flatten a second surface of the plurality of heat pipes relative to a heat absorbing surface of the thermally-conductive base; and performing the second mechanical processing procedure to abrade the heat absorbing surface of the thermally-conductive base and the second surface of the plurality of heat pipes so as to make the second surface of the plurality of heat pipes and the heat absorbing surface of the thermally-conductive base substantially coplanar and directly connected to each other for forming a same plane together.

10. The manufacturing method according to claim 6, wherein an abrasion depth in the second mechanical processing procedure is equal to or greater than 0.05 mm.

11. The manufacturing method according to claim 10, wherein the abrasion depth in the second mechanical processing procedure is smaller than or equal to 0.2 mm.

12. The manufacturing method according to claim 6, wherein a distance between the first surface and the heat dissipation surface is smaller than 0.05 mm in a thickness direction.

* * * * *